(12) United States Patent
Mukherjee et al.

(10) Patent No.: US 10,804,845 B2
(45) Date of Patent: Oct. 13, 2020

(54) APPARATUS FOR COMMUNICATION ACROSS A CAPACITIVELY COUPLED CHANNEL

(71) Applicant: TEXAS INSTRUMENTS INCORPORATED, Dallas, TX (US)

(72) Inventors: Subhashish Mukherjee, Bangalore (IN); Kumar Anurag Shrivastava, Bangalore (IN); Sreeram Subramanyam Nasum, Bangalore (IN)

(73) Assignee: TEXAS INSTRUMENTS INCORPORATED, Dallas, TX (US)

(*) Notice: Subject to any disclaimer, the term of this patent is extended or adjusted under 35 U.S.C. 154(b) by 0 days.

(21) Appl. No.: 16/601,081

(22) Filed: Oct. 14, 2019

(65) Prior Publication Data

US 2020/0044605 A1 Feb. 6, 2020

Related U.S. Application Data

(63) Continuation of application No. 15/427,856, filed on Feb. 8, 2017, now Pat. No. 10,447,202.

(51) Int. Cl.
*H03B 5/12* (2006.01)
*H01L 23/00* (2006.01)
(Continued)

(52) U.S. Cl.
CPC ..... *H03B 5/1228* (2013.01); *G06K 19/07749* (2013.01); *G06K 19/07771* (2013.01);
(Continued)

(58) Field of Classification Search
CPC .... H03B 5/1228; H03B 5/1212; H03B 5/124; H03B 5/1253; H03B 5/1215;
(Continued)

(56) References Cited

U.S. PATENT DOCUMENTS 6,441,449 B1 * 8/2002 Xu ..................... H01H 59/0009
257/312
9,064,198 B2 6/2015 Kato et al.
(Continued)

FOREIGN PATENT DOCUMENTS

| BY | 19535 | 10/2015 |
|----|-------|---------|
| WO | 2014060916 | 4/2014 |
| WO | 2016164587 | 10/2016 |

OTHER PUBLICATIONS

International Search Report for PCT Application No. PCT/US2018/017325, dated May 10, 2018 (2 pages).
(Continued)

*Primary Examiner* — Arnold M Kinkead
(74) *Attorney, Agent, or Firm* — Michael A. Davis, Jr.; Charles A. Brill; Frank D. Cimino

(57) ABSTRACT

For communication across a capacitively coupled channel, an example circuit includes a first plate substantially parallel to a substrate, forming a first capacitance intermediate the first plate and the substrate. A second plate is substantially parallel to the substrate and the first plate, the first plate intermediate the substrate and the second plate. A third plate is substantially parallel to the substrate, forming a second capacitance intermediate the third plate and the substrate. A fourth plate is substantially parallel to the substrate and the third plate, the third plate intermediate the substrate and the fourth plate. An inductor is connected to the first plate and the third plate, the inductor to, in combination with the first capacitance and the second capacitance, form an LC amplifier.

16 Claims, 4 Drawing Sheets

(51) Int. Cl.
*H01L 23/31* (2006.01)
*H01L 23/64* (2006.01)
*G06K 19/077* (2006.01)
*H02J 50/12* (2016.01)
*H01L 25/10* (2006.01)
*H04L 25/02* (2006.01)

(52) U.S. Cl.
CPC ........ *H01L 23/3107* (2013.01); *H01L 23/642* (2013.01); *H01L 23/645* (2013.01); *H01L 24/49* (2013.01); *H01L 25/105* (2013.01); *H02J 50/12* (2016.02); *H03B 5/1212* (2013.01); *H04L 25/0266* (2013.01); *H01L 24/05* (2013.01); *H01L 24/48* (2013.01); *H01L 2224/05553* (2013.01); *H01L 2224/48091* (2013.01); *H01L 2224/48101* (2013.01); *H01L 2224/48137* (2013.01); *H01L 2224/49096* (2013.01); *H01L 2224/49175* (2013.01); *H01L 2924/00014* (2013.01); *H01L 2924/1304* (2013.01); *H01L 2924/13091* (2013.01); *H01L 2924/19011* (2013.01); *H01L 2924/19041* (2013.01); *H01L 2924/19042* (2013.01); *H03B 2202/05* (2013.01)

(58) Field of Classification Search
CPC ...... H03B 2200/0038; H03B 2201/025; H03B 2202/05; H01L 2924/0002; H01L 2924/00; H01L 23/5227; H01L 2924/3011; H01L 27/0248; H01L 27/08; H01L 2924/09701; H01L 2224/48137; H01L 2224/48091; H01L 2224/48101; H01L 2224/05553; H01L 2224/49175; H01L 2224/49096; H01L 24/48; H01L 24/05; H01L 25/105; H01L 25/0266; H01L 24/49; H01L 23/3107; H01L 23/642; H01L 23/645; H04L 25/0266; G06K 19/07749; G06K 19/07771
USPC .................. 331/154, 96, 107 SL, 177 V, 167, 331/117 FE; 336/200, 232; 428/209
See application file for complete search history.

(56) References Cited

U.S. PATENT DOCUMENTS

| | | |
|---|---|---|
| 2007/0148895 A1 | 6/2007 | Van Schuylenbergh et al. |
| 2007/0164414 A1 | 7/2007 | Dokai et al. |
| 2009/0213914 A1 | 8/2009 | Dong et al. |
| 2010/0052826 A1 | 3/2010 | Callahan et al. |
| 2014/0361844 A1* | 12/2014 | Quevy .................. H03B 5/30 331/70 |

OTHER PUBLICATIONS

Extended European Search Report for EU Application No. 18751116.7, dated Dec. 10, 2019.

* cited by examiner

US 10,804,845 B2

APPARATUS FOR COMMUNICATION ACROSS A CAPACITIVELY COUPLED CHANNEL

CROSS-REFERENCE TO RELATED APPLICATION

This application is a continuation of U.S. patent application Ser. No. 15/427,856 filed Feb. 8, 2017, which is incorporated herein by reference.

TECHNICAL FIELD

This relates generally to electronic communications, and more particularly to communication across a capacitively coupled channel.

BACKGROUND

Electronic communications systems often need to communicate data from a first circuit operating in a first voltage domain to a second circuit operating in a second voltage domain. In some examples, the first voltage domain may be on the order of one hundred volts, whereas the second voltage domain may be on the order of one thousand volts. Alternatively, the first voltage domain might be thousands of volts higher than the second voltage domain (or vice-versa). Electrically coupling the two circuits might result in a loss of signal and/or data integrity and, in some examples, may cause damage to one or more of the circuits. To enable communications, the circuits may be connected in an isolated fashion using, for example, optical isolation, magnetic isolation, capacitive isolation, etc.

DETAILED DESCRIPTION OF EXAMPLE EMBODIMENTS

Figure 1:
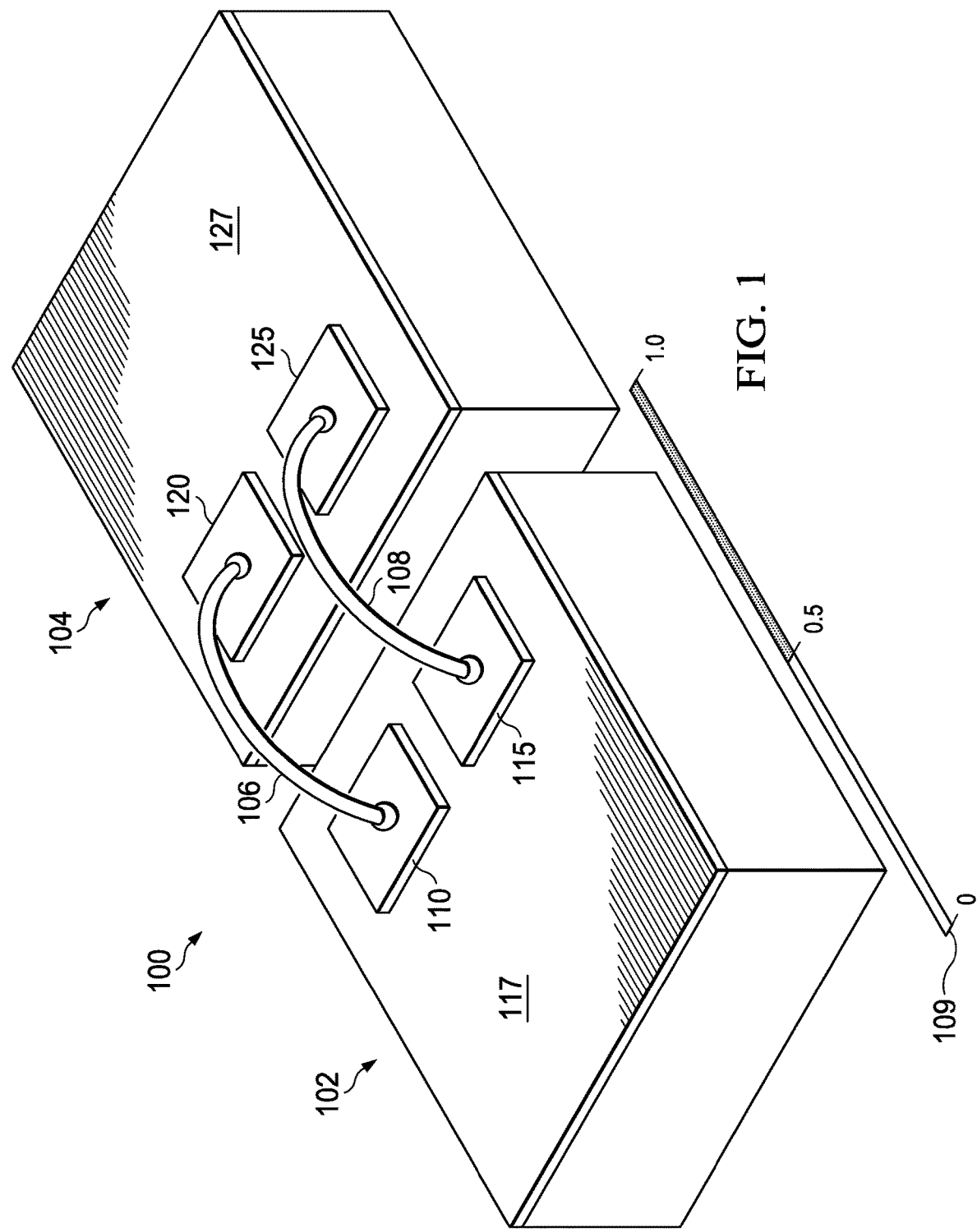
FIG. 1 is an isometric view of a first die and a second die connected via two bond wires.

The figures are not necessarily to scale. Instead, to clarify multiple layers and regions, the thickness of the layers may be enlarged in the drawings. Wherever possible, the same reference numbers are used throughout the drawing(s) and accompanying written description to refer to the same or like parts. As used in this description, stating that any part (e.g., a layer, film, area, or plate) is in any way positioned on (e.g., positioned on, located on, disposed on, or formed on, etc.) another part, means that the referenced part is either in contact with the other part, or that the referenced part is above the other part with one or more intermediate part(s) located therebetween. Stating that any part is in contact with another part means that no intermediate part is between the two parts.

Digital isolation of signals is an emerging technology. Two main technologies for digital isolation are transformers and isolation capacitors. Conventional isolation capacitor approaches require large power draws to operate amplifiers that enhance signal quality. Example approaches described herein utilize inductors within the isolation capacitor circuit to achieve passive gain, which has a much lower power requirement than prior active amplification approaches.

In examples described herein, both a primary side of the isolation circuit and a secondary side of the isolation circuit are tuned for passive gain. In some examples, the gain at a desired frequency can be three to four times the attenuated signal (or any other gain value), depending on the selected value(s) of the inductors, without requiring any current for active amplification. Tuning both a primary side (e.g., a transmit side) and a secondary side (e.g., a receive side) to a same frequency increases Common Mode Transient Immunity (CMTI) and Ground Noise Transient Immunity (GNTI) performance of the isolation system. In some examples, using an input signal frequency (e.g., a modulation frequency) that matches the tuned frequency of the transmit and receive sides further increases Common Mode Transient Immunity (CMTI) and Ground Noise Transient Immunity (GNTI) performance of the isolation system.

FIG. 1 is an isometric view of a communication system 100 including a first die 102 and a second die 104 connected via two bond wires 106, 108. The example isometric view of the illustrated example of FIG. 1 uses a scale 109 of 1 millimeter (mm). However, any other scale may additionally or alternatively be used. In the illustrated example of FIG. 1, the first example die 102 includes a first stack 110 and a second stack 115. The first example die 102 includes a first substrate 117. In the illustrated example of FIG. 1, the second example die 104 includes a third stack 120 and a fourth stack 125. The second example die 104 includes a second substrate 127.

In the illustrated example of FIG. 1, the first example bond wire 106 couples the first stack 110 and the third stack 120. In the illustrated example of FIG. 1, the second example bond wire 108 couples the second stack 115 and the fourth stack 125.

In the illustrated example of FIG. 1, the first example die 102 represents a transmit side of the example communication system 100 of FIG. 1. The second example die 104 represents a receive side of the example communication system 100 of FIG. 1. In the illustrated example of FIG. 1, the communication system 100 is represented as a unidirectional communication system that communicates from the first die 102 to the second die 104 via the bond wires 106, 108. However, in some examples, a bi-directional communication system may be implemented. In such examples, additional bond wires and/or stacks may be used to facilitate communication in both directions.

Figure 2:
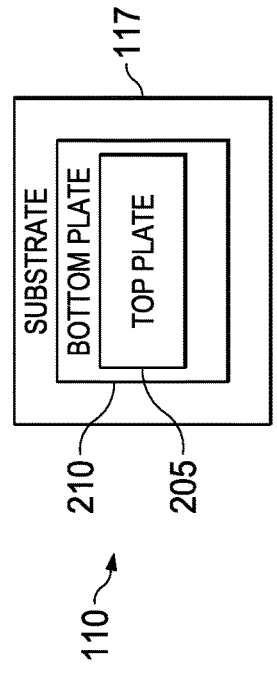
FIG. 2 is a side view of the first stack of FIG. 1.

FIG. 2 is a side view of the first stack 110 of FIG. 1. While the illustrated example of FIG. 2 is described in connection with the first stack 110 of FIG. 1, the example of FIG. 2 is also applicable to the second stack 115, the third stack 120, and the fourth stack 125 of FIG. 1. In the illustrated example of FIG. 2, the stack 110 includes a top plate 205 and a bottom plate 210. The bottom plate 210 is positioned intermediate the top plate 205 and the first substrate 117 (or the second substrate 127). In the illustrated example of FIG. 2, the top plate 205 and the bottom plate 210 are arranged substantially parallel to each other. In the illustrated example of FIG. 2, the top plate 205 and the bottom plate 210 are arranged substantially parallel to the substrate 117. As used herein, the plates and substrate are substantially parallel when a distance between the top plate 205 and the bottom plate 210, between the top plate 205 and the substrate 117, and/or between the bottom plate 210 and the substrate does not deviate from the average distance by more than twenty percent.

A first capacitance 215 is created between the top plate 205 and the bottom plate 210. A second capacitance 220 is created between the bottom plate 210 and the substrate. In the illustrated example of FIG. 2, the top plate 105 is connected to a bond wire 225 (e.g., the first bond wire 106, the second bond wire 108). In examples described herein, the bottom plate 210 receives an input electrical signal.

In the illustrated example of FIG. 2, the top plate 205 and the bottom plate 210 are encased in a dielectric 230. Accordingly, the dielectric 230 surrounds both the top plate 205 and the bottom plate 210 and is in contact with the substrate 117. In some examples, the dielectric 230 surrounds the substrate 117. In some examples, the same dielectric is used for an entire die. Accordingly, the dielectric of the first die 102 of FIG. 2 may encase a top plate and a bottom plate of the first stack 110, as well as a top plate and a bottom plate of the second stack 115. In examples described herein, the dielectric 230 is silicon dioxide. However, any other dielectric material may additionally or alternatively be used.

Figure 3:
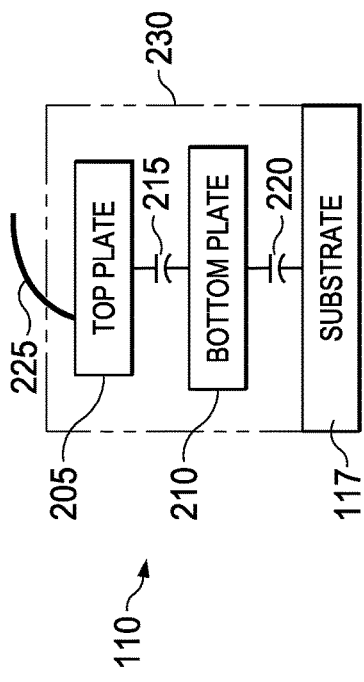
FIG. 3 is a top view of the first stack of FIGS. 1 and/or 2.

FIG. 3 is a top view of the first stack 110 of FIG. 1. While the illustrated example of FIG. 3 is described in connection with the first stack 110 of FIG. 1, the example of FIG. 3 is also applicable to the second stack 115, the third stack 120, and the fourth stack 125 of FIG. 1. In the illustrated example of FIG. 3, the top plate 205 has a surface area smaller than the bottom plate 210. The bottom plate 210 has a surface area smaller than the substrate 117. As a result of the difference in surface area and/or the spacing between the top plate 205 and the bottom plate 210, the capacitances 215, 220 are different. The example view 300 of the illustrated example of FIG. 3 represents the first stack 110 of FIG. 1. However, the second stack 115, the third stack 120, and the fourth stack 125 may be arranged in a similar fashion.

In implementation, it is desirable to have the sizes of the top plates match in size among the first stack 110, the second stack 115, the third stack 120, and the fourth stack 125. Likewise, it is desirable to have the sizes of the bottom plates match in size among the first stack 110, the second stack 115, the third stack 120, and the fourth stack 125. Using matching plate sizes ensures that the capacitances formed between the substrates and the plates match between each of the first stack 110, the second stack 115, the third stack 120, and the fourth stack 125.

Figure 4:
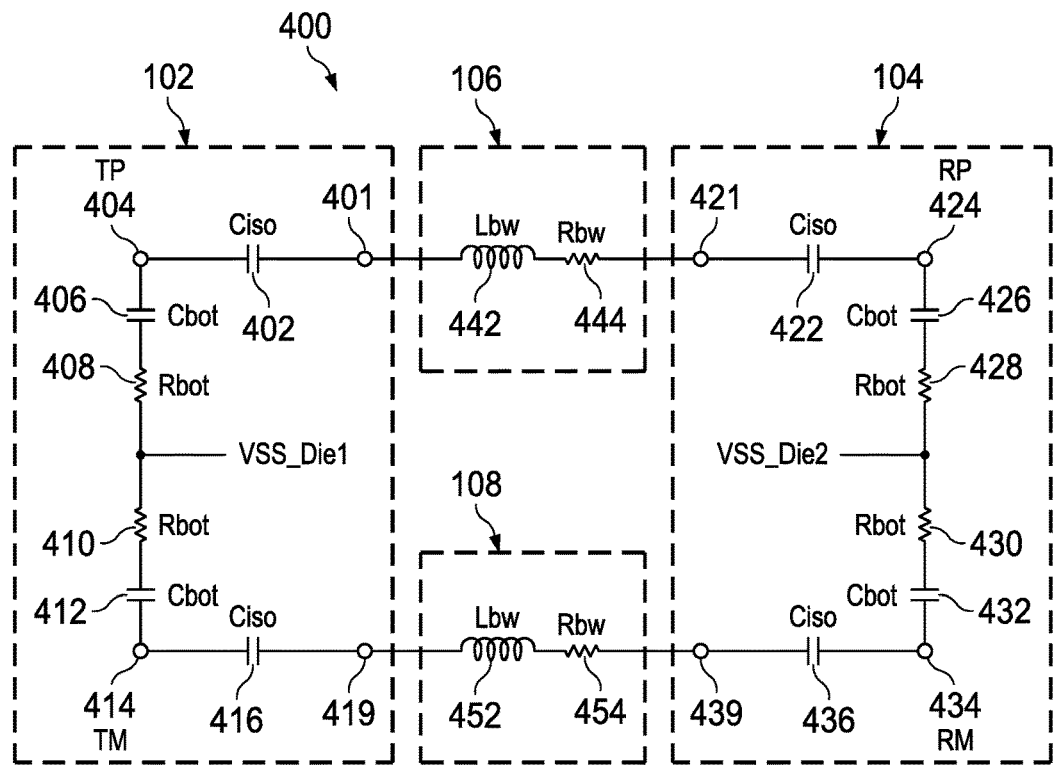
FIG. 4 is a circuit diagram of the example first die, the example second die, and the example bond wires of FIG. 1.

FIG. 4 is a circuit diagram 400 of the example first die 102, the example second die 104, and the example bond wires 106, 108 of FIG. 1. In the illustrated example of FIG. 4, the example first die 102 includes a first capacitance 402, a second capacitance 406, a first resistance 408, a second resistance 410, a third capacitance 412, and a fourth capacitance 416. In the illustrated example of FIG. 4, four nodes 401, 404, 414, 419 are represented within the first example die 102. In the illustrated example of FIG. 4, the first node 401 represents a first top plate of the first die 102 (e.g., the top plate of the first stack 110 FIG. 1). The second example node 404 represents a first bottom plate of the first die 102 (e.g., the bottom plate of the first stack 110 of FIG. 1). The third example node 414 represents a second bottom plate of the first die 102 (e.g., the bottom plate of the second stack 115 of FIG. 1). The fourth example node 419 represents a second top plate of the first die 102 (e.g., the top plate of the second stack 115 of FIG. 1).

In the illustrated example of FIG. 4, the first capacitance 402 represents a capacitance formed between the first node 401 and the second node 404 (e.g., between the top and bottom plates of the first stack 110 of FIG. 1). The second capacitance 406 represents a capacitance formed between the second node 404 and a substrate of the first die 102 (e.g., a capacitance formed between the bottom plate of the first stack 110 FIG. 1 and the substrate 117 of FIG. 1). The first resistance 408 represents a resistance of the substrate. Thus, the first resistance 408 models losses experienced at the substrate.

In the illustrated example of FIG. 1, the second resistance 410 represents a resistance of the substrate (e.g., the second resistance 410 models losses experienced at the substrate). The third capacitance 412 represents capacitance formed between the substrate of the first die 102 and the third node 414 (e.g., between the substrate 117 and the bottom plate of the second stack 115 of FIG. 1). The fourth example capacitance 416 represents capacitance formed between the third node 414 and the fourth node 419 (e.g., between the bottom plate of the second stack 115 and the top plate of the second stack 115 of FIG. 1).

In the illustrated example of FIG. 4, the example second die 104 includes a fifth capacitance 422, a sixth capacitance 426, a third resistance 428, a fourth resistance 430, a seventh capacitance 432, and an eighth capacitance 436. In the illustrated example of FIG. 4, four nodes 421, 424, 434, 439 are represented within the second example die 104. In the illustrated example of FIG. 4, the fifth node 422 represents a first top plate of the second die 104 (e.g., the top plate of the third stack 120 FIG. 1). The sixth example node 424 represents a first bottom plate of the second die 104 (e.g., the bottom plate of the third stack 120 of FIG. 1). The seventh example node 434 represents a second bottom plate of the second die 104 (e.g., the bottom plate of the fourth stack 125 of FIG. 1). The eighth example node 439 represents a second top plate of the second die 104 (e.g., the top plate of the fourth stack 120 of FIG. 1).

In the illustrated example of FIG. 4, the fifth capacitance 422 represents a capacitance formed between the fifth node 421 and the sixth node 424 (e.g., between the top and bottom plates of the third stack 120 of FIG. 1). The sixth capacitance 426 represents a capacitance formed between the sixth node 424 and a substrate of the second die 104 (e.g., a capacitance formed between the bottom plate of the third stack 120 FIG. 1 and the substrate 127 of FIG. 1). The third resistance 428 represents a resistance of the substrate (e.g., the third resistance 428 models losses experienced at the substrate).

In the illustrated example of FIG. 1, the fourth resistance 430 represents a resistance of the substrate (e.g., the fourth resistance 430 models losses experienced at the substrate). The seventh capacitance 432 represents a capacitance formed between the substrate of the first die 102 and the seventh node 434 (e.g., between the substrate 127 and the bottom plate of the fourth stack 125 of FIG. 1). The eighth example capacitance 436 represents a capacitance formed between the seventh node 434 and the eighth node 439 (e.g., between the bottom plate of the fourth stack 125 and the top plate of the fourth stack 125 of FIG. 1).

In examples described herein, values for the capacitances and resistances of the first die 102 and the second die 104 are based on the physical arrangement of the substrates and the components of the stacks (e.g., the top plates and the bottom plates). Examples described herein assume that the structure of the first stack 110, the second stack 115, the third stack 120, and the fourth stack 125 are consistent. Thus, the values for the first capacitance 402, the fourth capacitance 416, the fifth capacitance 422 and the eighth capacitance 436 match (and are represented as Ciso in FIG. 5). Likewise, the values for the second capacitance 406, the third capacitance 412, the sixth capacitance 426, and the seventh capacitance 432 match (and are represented as Cbot in FIG. 5). However, in some examples, the structures might not match (intentionally or otherwise), resulting in different values for the capacitances.

In the illustrated example of FIG. 4, a first end of the first bond wire 106 is connected to the first node 401 (e.g., to the top plate of the first stack 110). A second end of the first bond wire 106 is connected to the fifth node 421 (e.g., the top plate of the third stack 120 of FIG. 1). The example first bond wire 106 is represented by a first inductance 442 and a fifth resistance 444.

In the illustrated example of FIG. 4, a first end of the second bond wire 108 is connected to the fourth node 419 (e.g. the top plate of the second stack 115 of FIG. 1). A second end of the second bond wire 108 is connected to the eighth node 439 (e.g., the top plate of the fourth stack 125 of FIG. 1). The example second bond wire 108 is represented by a second inductance 452 and a sixth resistance 454.

In the illustrated example of FIG. 4, a voltage signal is applied across the second node 404 and the third node 414, and is received at the sixth node 424 and the seventh node 434. In examples described herein, the voltage difference between the sixth node 424 and the seventh node 434 is attenuated with respect to the voltage difference between the second node 404 and the third node 414. In some examples, the attenuation of the voltage is a result of losses experienced across isolation capacitances (e.g., the first capacitance 402, the fourth capacitance 416, the fifth capacitance 422, and/or the eighth capacitance 436). In some examples, attenuation is the result of differences between the capacitance formed between the substrate(s) and the bottom plate(s) as compared to the capacitance formed between the bottom plate(s) and the top plate(s). In some examples, attenuation is also the result of parasitic capacitances between the bond wires 106, 108.

To facilitate more reliable signal transmission (e.g., transmission with lower attenuation), some example approaches utilize amplification at the receiving side (e.g., at the second die 104). However, noise is also amplified using this approach. Because noise is also amplified, a signal to noise ratio of the transmission is not improved. An alternative approach utilizes an increased voltage differential at the transmission side (e.g., at the first die 102). However, providing an increased voltage differential is not always feasible, as voltage limits on transistors used to apply the voltage differential across the second and third nodes 404, 414 might exist.

Figure 5:
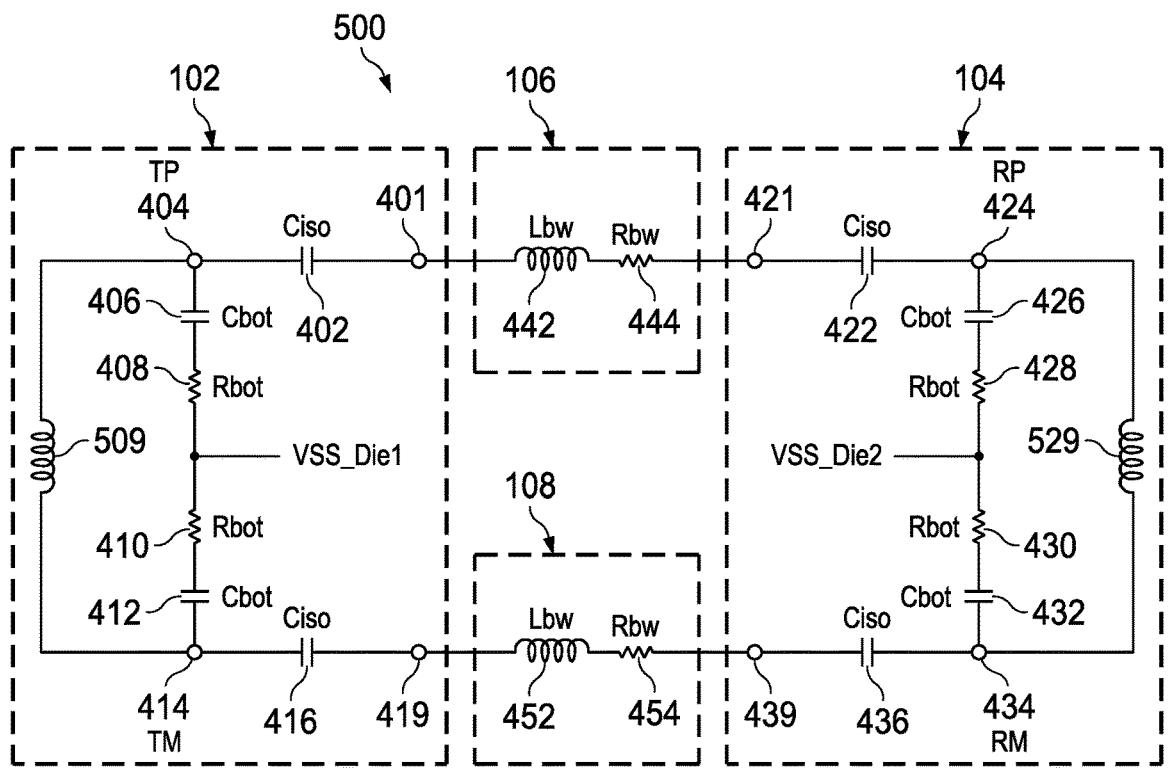
FIG. 5 is a circuit diagram of the example first die, the example second die, and the example bond wires of FIGS. 1 and/or 4 constructed in accordance with the teachings of this description.

To address the deficiencies of existing approaches, inductors are connected between each of the bottom plates of a die. The inductor, in parallel with the capacitances between the bottom plates and the substrate, forms an LC tank that creates a high impedance at a frequency. An example approach using inductors in parallel with the capacitances formed between the bottom plates and the substrate(s) is shown in FIG. 5. FIG. 5 is a circuit diagram of the example first die 102, the example second die 104, and the example bond wires 106, 108 of FIGS. 1 and/or 4 constructed in accordance with the teachings of this description. In the illustrated example of FIG. 5, a third inductor 509 and a fourth inductor 529 are added to the circuit 400 of FIG. 4. In the illustrated example of FIG. 5, the third inductor 509 is included intermediate the second node 404 and the third node 414. The fourth inductor 529 is included intermediate the sixth node 424 and the seventh node 434.

In the illustrated example of FIG. 5, the third inductor 509 is in parallel with the second capacitance 406 and the third capacitance 412. The fourth inductor 529 is in parallel with the sixth capacitance 426 and the seventh capacitance 432. As a result of the parallel relationship, a high impedance is created at a resonant frequency between the sixth example node 424 and the seventh example node 434. The resonant frequency is defined by Equation (1) below:

$$\text{frequency} = \frac{1}{\sqrt{\frac{Cbot * L}{2}}} \quad (1)$$

In the example Equation (1) above, Cbot represents the capacitance formed between a bottom plate of a stack (e.g., the first stack 110 of FIG. 1) and the corresponding substrate. L represents the value of the inductor (e.g., the third inductor 509 or the fourth inductor 529). When each of the transmit side (e.g., the first die 102) and the receive side (e.g., the second die 104) are tuned such that their frequencies match, noise is filtered out, thereby improving the signal to noise ratio of the received signal. In some examples, an additional capacitor is added in parallel with one or more of the inductors 509, 529 to facilitate fine tuning of the frequency. Such an approach does not require active amplification and, as a result, does not consume large amounts of power.

Figure 6:
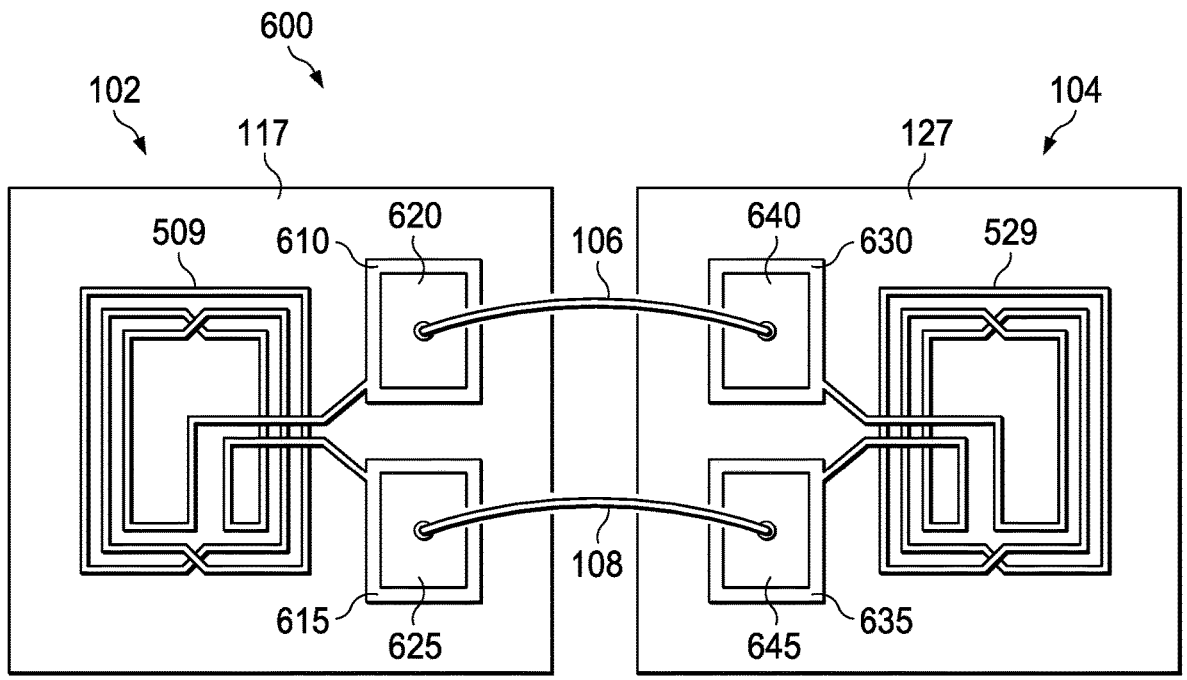
FIG. 6 is a diagram of the example first die, the example second die, the bond wires, and the inductors of FIG. 5.

FIG. 6 is a diagram of the example first die 102, the example second die 104, the bond wires 106, 108, and the inductors 509, 529 of FIG. 5. In the illustrated example of FIG. 6, the first inductor 509 is connected to a first bottom plate 610 and a second bottom plate 615. The second inductor 529 is connected to a third bottom plate 630 and a fourth bottom plate 635. The first bond wire 106 is connected to a first top plate 620 and a third top plate 640. The second bond wire 108 is connected to a second top plate 625 and a fourth top plate 645.

In the illustrated example of FIG. 6, the inductors 509, 529 are planar inductors. In the illustrated example of FIG. 6, the inductors 509, 529 are arranged in a plane(s) that is/are substantially parallel to a surface of the corresponding substrates 117, 127. As used herein, the inductors are substantially parallel to the surface(s) of the corresponding substrates when a distance between the inductor and the corresponding substrate does not deviate from the average distance between the inductor and the corresponding substrate by more than twenty percent. In some examples, the inductors are encased in the dielectric 230 of FIG. 2. However, any other type of inductor may additionally or alternatively be used. For example, one or more of the inductors may be implemented as an external component (e.g., a discrete component separate from the die 102, 104).

Figure 7:
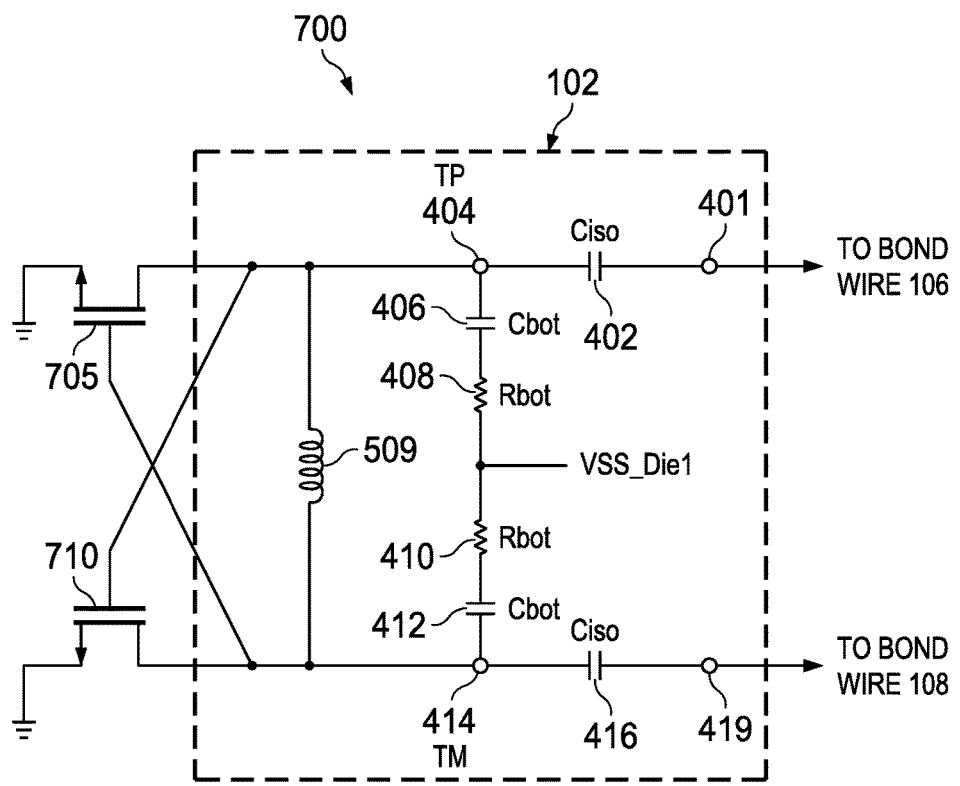
FIG. 7 is a circuit diagram illustrating an example approach for transmitting and/or driving a signal across the capacitively coupled channels of FIGS. 5 and/or 6.

FIG. 7 is a circuit diagram illustrating an example approach for transmitting and/or driving a signal across the capacitively coupled channels of FIGS. 5 and/or 6. In the illustrated example of FIG. 7, a first transistor 705 and a second transistor 710 are added to the circuit 500 of FIG. 5. In the illustrated example of FIG. 7, the first transistor 705 is an n-type metal oxide semiconductor field effect transistor (MOSFET). In some examples, the ground nodes of the first transistor 705 and the second transistor 710 can be connected together and/or connected to a current source. In the illustrated example of FIG. 7, the second transistor 710 is an n-type MOSFET.

A first terminal of the first transistor 705 is connected to ground. A second terminal of the first transistor 705 is connected to the second node 404 (e.g., the bottom plate of the first stack 110). A third terminal of the first transistor 705 is connected to the third node 414 (e.g., the bottom plate of the second stack 115). A first terminal of the second transistor 710 is connected to ground. A second terminal of the second transistor 710 is connected to the third node 414 (e.g., the bottom plate of the second stack 115). A third terminal of the second transistor 710 is connected to the second node 404 (e.g., the bottom plate of the first stack 110).

In the illustrated example of FIG. 7, the first terminal of the first transistor 705 is a source terminal, the second terminal of the first transistor 705 is a drain terminal, and the third terminal of the first transistor 705 is a gate terminal. In the illustrated example of FIG. 7, the first terminal of the second transistor 710 is a source terminal, the second terminal of the second transistor 710 is a drain terminal, and the third terminal of the second transistor 710 is a gate terminal. When arranged in such a fashion, the first and second transistors 705, 710 form an oscillator that oscillates at a frequency defined by Equation (1) above. Accordingly, the frequency of the oscillator matches the tuned frequency of the LC tank. As a result, the oscillation frequency and resonant frequency of the LC tank can be tuned together. In some examples, the frequency can be tuned to a very high value, thereby enabling design of high data rate transmission systems. In implementation, the frequency is typically chosen based on its compatibility with a modulation scheme that is used in the signal to be transmitted.

Figure 8:
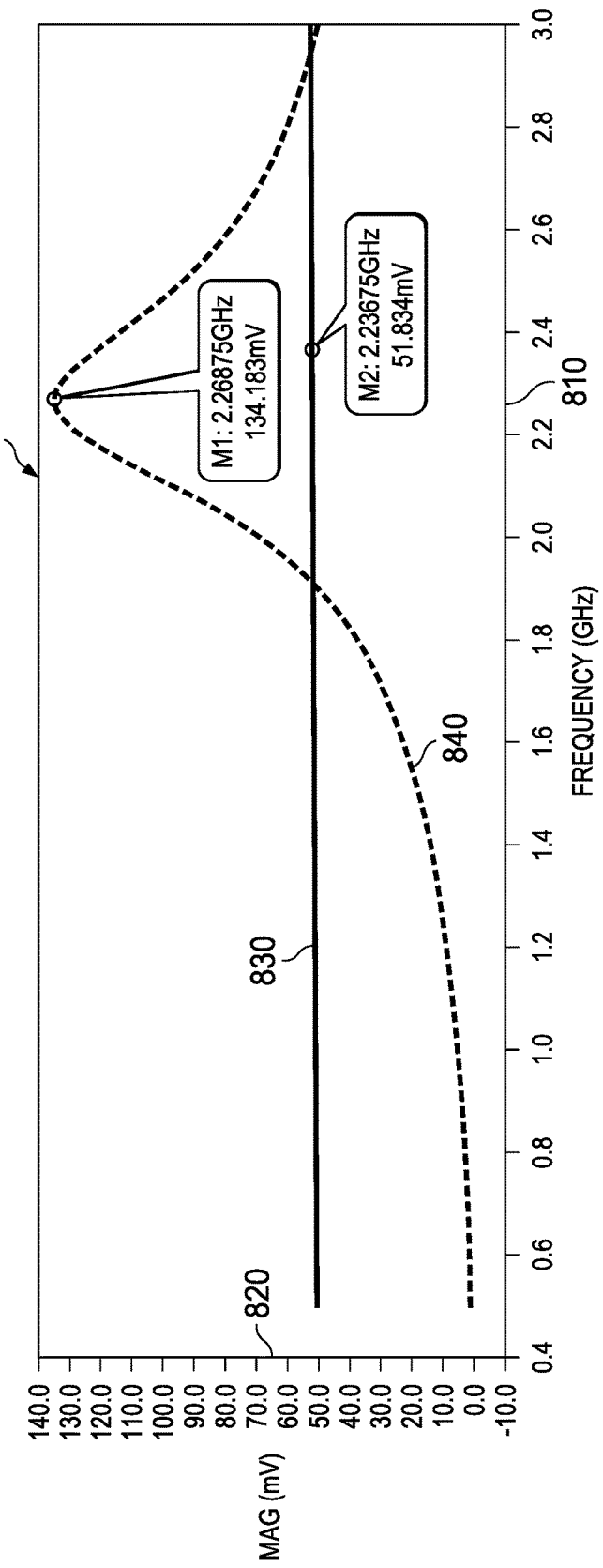
FIG. 8 is a magnitude plot illustrating magnitudes of example received signals across a frequency spectrum.

FIG. 8 is a magnitude plot 800 illustrating magnitudes of example received signals across a frequency spectrum. A horizontal axis 810 of the example plot 800 of FIG. 8 represents a frequency, in GigaHertz (GHz). A vertical axis 820 of the example plot 800 of FIG. 8 represents a magnitude of the received signal, in millivolts (mV). In the illustrated example of FIG. 8, received signals are shown. A first received signal 830 represents a signal received using the circuit 400 of FIG. 4 (e.g., without inductors intermediate the bottom plates of the respective dies.). A second received signal 840 represents a signal received using the circuit 500 of FIG. 5 (e.g., with inductors intermediate the bottom plates of the respective dies). In the illustrated example of FIG. 5, the circuit corresponding to the second received signal 840 is tuned to a resonant frequency of approximately 2.26875 GHz. At 2.26872 GHz, the first received signal 830 has a magnitude of approximately 51 mV, whereas the second received signal 840 has a magnitude of approximately 134 mV. In practice, the resultant values can be different depending upon a number of factors such as, for example, the tuned frequency, the amplitude of the input signal, the gain(s) (Q) of the passive amplifier(s), etc. Thus, as a result of the tuning by the addition of the inductors 509, 529, the magnitude of the received signal at the tuned frequency is larger than it would have otherwise been. As a result, signal transmission over a capacitively isolated connection is made more reliable.

From the foregoing, the above-described apparatus and articles of manufacture enable transmission of a voltage differential signal using a capacitive coupling. In examples described herein, the inclusion of an inductor intermediate bottom plates of a stacked capacitive coupling system creates an LC tank that operates as a passive amplifier. This passive amplification can be tuned to a desired frequency and, when data is transmitted at that frequency, a signal to noise ratio of the resultant data transfer is increased.

Modifications are possible in the described embodiments, and other embodiments are possible, within the scope of the claims.

What is claimed is:

1. A circuit comprising:
a substrate;
a first plate substantially parallel to the substrate and forming a first capacitance intermediate the first plate and the substrate;
a second plate substantially parallel to the substrate and the first plate, the first plate intermediate the substrate and the second plate;
a third plate substantially parallel to the substrate and forming a second capacitance intermediate the third plate and the substrate;
a fourth plate substantially parallel to the substrate and the third plate, the third plate intermediate the substrate and the fourth plate; and
an inductor connected to the first plate and the third plate, in which the inductor is a planar inductor substantially parallel to the substrate, and an LC amplifier is formed by a combination of the inductor, the first capacitance and the second capacitance.

2. A circuit comprising:
a substrate;
a first plate substantially parallel to the substrate and forming a first capacitance intermediate the first plate and the substrate, in which a first surface area of the first plate is smaller than a second surface area of the substrate;
a second plate substantially parallel to the substrate and the first plate, the first plate intermediate the substrate and the second plate;
a third plate substantially parallel to the substrate and forming a second capacitance intermediate the third plate and the substrate;
a fourth plate substantially parallel to the substrate and the third plate, the third plate intermediate the substrate and the fourth plate; and
an inductor connected to the first plate and the third plate, in which an LC amplifier is formed by a combination of the inductor, the first capacitance and the second capacitance.

3. The circuit of claim 2, wherein the inductor is a planar inductor.

4. The circuit of claim 3, wherein the planar inductor is substantially parallel to the substrate.

5. The circuit of claim 2, wherein a surface area of the second plate is smaller than the first surface area of the first plate.

6. The circuit of claim 2, wherein the first plate is separated from the substrate by a first distance and the third plate is separated from the substrate by the first distance.

7. The circuit of claim 6, wherein the second plate is separated from the first plate by a second distance and the fourth plate is separated from the third plate by the second distance.

8. The circuit of claim 2, wherein the first plate, the second plate, the third plate, and the fourth plate are encased in a dielectric.

9. A circuit comprising:
a substrate;
a first plate substantially parallel to the substrate and forming a first capacitance intermediate the first plate and the substrate;
a second plate substantially parallel to the substrate and the first plate, the first plate intermediate the substrate and the second plate;
a third plate substantially parallel to the substrate and forming a second capacitance intermediate the third plate and the substrate;
a fourth plate substantially parallel to the substrate and the third plate, the third plate intermediate the substrate and the fourth plate;
an inductor connected to the first plate and the third plate, in which an LC amplifier is formed by a combination of the inductor, the first capacitance and the second capacitance;
a first transistor having a first terminal connected to the first plate and a second terminal connected to the third plate; and
a second transistor having a third terminal connected to the third plate and a fourth terminal connected to the first plate, in which the first transistor and the second transistor form an oscillator.

10. The circuit of claim 9, wherein the LC amplifier has a peak amplitude at a first frequency, the oscillator is to oscillate at the first frequency.

11. A circuit comprising:
a substrate;
a first plate substantially parallel to the substrate and forming a first capacitance intermediate the first plate and the substrate;
a second plate substantially parallel to the substrate and the first plate, the first plate intermediate the substrate and the second plate;
a third plate substantially parallel to the substrate and forming a second capacitance intermediate the third plate and the substrate;
a fourth plate substantially parallel to the substrate and the third plate, the third plate intermediate the substrate and the fourth plate;
an inductor connected to the first plate and the third plate, in which an LC amplifier is formed by a combination of the inductor, the first capacitance and the second capacitance;
a first bond wire connected to the second plate; and
a second bond wire connected to the fourth plate, the first plate and the third plate, in which the second bond wire is adapted to receive a differential voltage signal for transmission via the first bond wire and the second bond wire.

12. The circuit of claim 1, wherein a first surface area of the first plate is smaller than a surface area of the substrate.

13. The circuit of claim 12, wherein a surface area of the second plate is smaller than the first surface area of the first plate.

14. The circuit of claim 1, wherein the first plate is separated from the substrate by a first distance, and the third plate is separated from the substrate by the first distance.

15. The circuit of claim 14, wherein the second plate is separated from the first plate by a second distance and the fourth plate is separated from the third plate by the second distance.

16. The circuit of claim 1, wherein the first plate, the second plate, the third plate, and the fourth plate are encased in a dielectric.

* * * * *